United States Patent
Nagata

(10) Patent No.: US 7,927,763 B2
(45) Date of Patent: Apr. 19, 2011

(54) PELLICLE FOR PHOTOLITHOGRAPHY AND PELLICLE FRAME

(75) Inventor: Yoshihiko Nagata, Gunma (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 1326 days.

(21) Appl. No.: 11/311,413

(22) Filed: Dec. 20, 2005

(65) Prior Publication Data

US 2006/0141209 A1 Jun. 29, 2006

(30) Foreign Application Priority Data

Dec. 28, 2004 (JP) ................... 2004-381335

(51) Int. Cl.
*G03F 1/00* (2006.01)
(52) U.S. Cl. .............................. 430/5; 428/14
(58) Field of Classification Search .............. 430/5
See application file for complete search history.

(56) References Cited

U.S. PATENT DOCUMENTS

| | | | |
|---|---|---|---|
| 5,470,621 A * | 11/1995 | Kashida et al. | 428/14 |
| 6,254,942 B1 | 7/2001 | Tanaka | |
| 2006/0115741 A1 * | 6/2006 | Kozeki et al. | 430/5 |

FOREIGN PATENT DOCUMENTS

| | | |
|---|---|---|
| JP | A 58-219023 | 12/1983 |
| JP | U 61-41255 | 3/1986 |
| JP | B2 63-27707 | 6/1988 |
| JP | A-2000-352812 | 12/2000 |
| JP | A-2001-279359 | 10/2001 |
| JP | A-2001-350253 | 12/2001 |
| JP | A 2003-57804 | 2/2003 |

* cited by examiner

*Primary Examiner* — Mark F Huff
*Assistant Examiner* — Stewart A Fraser
(74) *Attorney, Agent, or Firm* — Oliff & Berridge, PLC

(57) ABSTRACT

There is disclosed a pellicle 1 for photolithography comprising, a pellicle frame 2 for constituting a pellicle for photolithography, wherein the frame is made of an aluminum alloy whose surface is anodized, and each content of sulfate ion, nitrate ion, chlorine ion, and organic acid (total of oxalic acid, formic acid, and acetic acid) is 1.1 ppm or less in elution concentration after immersed in 100 ml of pure water at 25° C. for 168 hours, per 100 $cm^2$ of a surface area of the frame, and a pellicle film 3 that is adhered to one end face of the frame. Thereby, there can be provided a pellicle that can effectively prevent haze from being generated on a mask substrate even in a photolithography process with a wavelength being shorter.

6 Claims, 1 Drawing Sheet

`US 7,927,763 B2`

PELLICLE FOR PHOTOLITHOGRAPHY AND PELLICLE FRAME

BACKGROUND OF THE INVENTION

1. Field of the Invention

The present invention relates to a pellicle that is used in a photolithography process when producing a semiconductor device and such, particularly relates to a pellicle frame for constituting the pellicle.

2. Description of the Related Art

In the production of a semiconductor such as LSI and super LSI or in the production of a liquid crystal display panel and such, there is a photolithography process in which a patterning is performed by irradiating a semiconductor wafer or a liquid crystal display panel with a light.

If dust is adhered to an exposure original plate to be used for patterning (called a mask for lithography, a reticule, or the like), there are caused problems that the dust absorbs light or refracts light, thus, transferred pattern may be deformed, its edge may be rough, and also its base may be soiled to be black, resulting in degradation of dimension, quality, appearance or the like.

For preventing dust from adhering to the original plate, the works relating to lithography are usually done in a clean room. However, since it is difficult to always keep an exposure original plate clean even in the clean room, a pellicle for avoiding dust is generally attached to the surface of the exposure original plate.

FIG. 2 is a schematic sectional view showing a fundamental constitution of a pellicle 11, where a pellicle film 13 which transmits the light for exposure is adhered to one end face of a pellicle frame 12. For the pellicle frame 12, materials such as aluminum alloy of A7075 and such, stainless, polyethylene, or the like are used, and for the pellicle film 13, there is used a transparent film which consists of, for example, nitrocellulose, accetylcellulose, fluorinated polymer, or the like and well transmits the light used for exposure (See, Japanese Patent Application Laid-open (kokai) No. 58-219023).

When the pellicle film 13 is adhered to the pellicle frame 12, a volatile solvent is applied between the frame 12 and the film 13, and air-dried (See, Japanese Patent Application Laid-open (kokai) No. 58-219023), or the frame 12 and the film 13 are adhered through an adhesive 16 such as acrylate resin, epoxy resin, or the like (See, Japanese Patent publication (kokoku) No. 63-27707).

Moreover, at the lower end face of the pellicle frame 12, for adhering it to the exposure original plate, there is provided an adhesive layer 14 consisting of polybutene resin, polyvinyl acetate resin, acrylate resin, or the like, and an adhesive layer-protecting liner 15 for the purpose of protecting the adhesive layer 14.

By adhering such a pellicle 11 to the exposure original plate, dust does not adhere directly to a surface of the exposure original plate, but to the pellicle film 13. And if the focus is adjusted to the pattern of the exposure original plate when performing the lithography, dust on the pellicle film 13 can be prevented from affecting the transfer.

On the other hand, if a pattern formation surface of the mask (the reticule) is hermetically sealed by the pellicle, it is feared that there are caused problems such that the pellicle film is swollen to contact with a portion of the exposure device by lowering of the surrounding barometric pressure, or the like. Accordingly, there is suggested a pellicle that by forming a vent and installing a filter at a side surface of the frame, foreign materials such as dust can be prevented from infiltrating and at the same time barometric pressure can be adjusted (See, Japanese Utility Model Application Laid-open (kokai) No. 61-41255). Furthermore, for excluding the affection of gas existing in the exposure environment, it is also suggested to provide a chemical filter containing titanium oxide and such (See, Japanese Patent Application Laid-open (kokai) No. 2003-57804)

In recent years, the pattern rule of LSI has become finer to sub-quarter micrometer, along with this, wavelength of the exposure light source has become further shorter. KrF excimer laser (248 nm), ArF excimer laser (193 nm), and further $F_2$ laser (157 nm) are being used as well as g-ray (436 nm) and i-ray (365 nm) by a mercury lamp that have ever predominated.

Along with wavelength of the exposure being shorter as described above, energy that a light has becomes higher naturally. In the case of using a high energy light, gaseous substance existing in the exposure atmosphere reacts easily as compared to a light with comparative long wavelength used conventionally, thus a possibility that reaction products are generated becomes drastically higher. If such reaction products are adhered to the mask, it is feared to affect fine patterning.

Accordingly, it has been desired that the gaseous substance is reduced as much as possible, the reticule is sufficiently cleaned, generation of gases from components of the pellicle, namely a reticule adhesive layer (sticking layer), a film adhesive, a coating agent coated on the inner wall of the frame, or the like are lowered. And improvement is being made.

However, even though cleaning of the reticule and lowering of the gas generation from components of the pellicle are improved, there are cases that cloudy foreign materials which are referred to as haze are generated on the mask substrate. The generation of such haze causes degradation of process yield in semiconductor manufacturing.

SUMMARY OF THE INVENTION

The present invention was accomplished in view of the aforementioned problems, and its main object is to provide a pellicle that can effectively prevent haze from being generated on a mask substrate even in a photolithography process with a wavelength being shorter.

In order to accomplish the above object, the present invention provides a pellicle frame for constituting a pellicle for photolithography, wherein the frame is made of an aluminum alloy whose surface is anodized, and each content of sulfate ion, nitrate ion, chlorine ion, and organic acid (total of oxalic acid, formic acid, and acetic acid) is 1.1 ppm or less in elution concentration after immersed in 100 ml of pure water at 25° C. for 168 hours, per 100 $cm^2$ of a surface area of the frame.

The above-described pellicle frame suppresses emanation of acids causing generation of haze, particularly can effectively suppress generation of products which are caused by sulfuric acid and the like that are contained in an oxide layer. Therefore, in the case that a pellicle is produced by using this pellicle frame, particularly there can be effectively suppressed generation of haze on a mask substrate even if the pellicle is used in a photolithography process in which a light with a short wavelength is used.

As an aluminum alloy, there can be preferably used an Al—Mg alloy, an Al—Mg—Si alloy, or an Al—Zn—Mg—Cu alloy. Particularly, a JIS A5052 material, a JIS A6061 material, or a JIS A7075 material is preferable.

If the pellicle frame, wherein an anodic oxide film is formed on the above aluminum alloy as a parent material and a concentration of the acids is suppressed, can effectively prevent haze from being generated, and also it is lightweight and has a small deformation. And thus, the pellicle frame becomes extremely excellent.

Moreover, there is provided a pellicle for photolithography comprising, at least, a pellicle frame and a pellicle film adhered to one end face of the pellicle frame, wherein the pellicle frame is the one of the above-described pellicle frames according to the present invention.

The pellicle for photolithography having a pellicle frame according to the present invention as described above is that emanation of acids from the anodic oxide film of the frame is extremely suppressed. Therefore, when a photolithography is performed with the pellicle adhered to a mask substrate, it is possible to effectively suppress generation of haze on a mask substrate even in the case that particularly a light with a shorter wavelength is used. Thus, process yield of devices can be certainly improved.

The pellicle frame according to the present invention is made of an aluminum alloy whose surface is anodized. Particularly, amount of acids such as sulfuric acid, nitric acid, and organic acids is extremely reduced. Therefore, a pellicle having the above-described pellicle frame can effectively suppress generation of haze on a mask substrate even if the pellicle is used in a photolithography process in which particularly a light with a short wavelength is used. Therefore, process yield of devices can be certainly improved.

DETAILED DESCRIPTION OF THE PREFERRED EMBODIMENTS

Hereinafter, the present invention will be described in detail.

The present inventor diligently researched and continually studied with regard to the cause of haze and foreign materials that are generated on the mask substrate in a photolithography process. The following was found.

In a conventional pellicle having a pellicle frame where an anodic oxide film is formed on a surface of an aluminum alloy, during staining, sealing, surface-etching, and such as well as forming an anodic oxide film, acids such as sulfuric acid, organic acid (such as oxalic acid, acetic acid), and nitric acid, or ionic species thereof have been taken in the film. The acids, the ionic species, or the like which have been taken in the film are separated from the frame to generate in a gaseous state in a closed space formed by the pellicle and the mask while g-ray, or i-ray, KrF laser, ArF laser, $F_2$ laser or the like in an ultraviolet region is irradiated in the lithography process, or while the photo mask is stored. And, in the exposure they are photochemically reacted with ammonia, cyanide, other hydrocarbon components or the like which exist in environment or is separately generated from other components of the pellicle. Substances as represented by ammonium sulfate and such are generated, and thereby a cloud which is referred to as so-called haze or a microparticle is generated.

Accordingly, the present inventor thought that generation of haze could be effectively suppressed if the pellicle frame was that the above-described acids contained mainly in an anodic oxide film of a frame made of aluminum alloy were reduced. By more researching and studying continually, it was found that if each content of sulfate ion, nitrate ion, chlorine ion, and organic acid (total of oxalic acid, formic acid, and acetic acid) is suppressed to be 1.1 ppm or less in elution concentration after immersed in 100 ml of pure water at 25° C. for 168 hours, per 100 $cm^2$ of a surface area of the frame, generation rate of haze can be suppressed to be extremely low even in the exposure environment by an ultraviolet radiation with a short wavelength. Thus, the present invention was accomplished.

Hereinafter, based on appended drawings, the present invention will be more concretely described.

Figure 1:
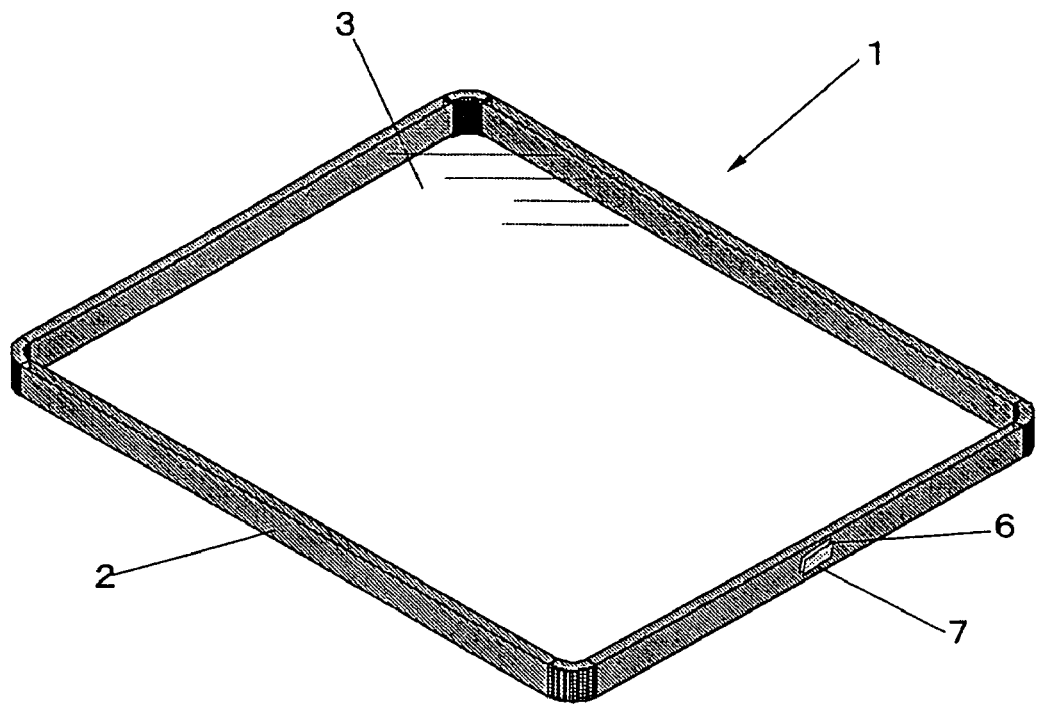
FIG. 1 is a schematic view showing one example of a pellicle having a pellicle frame according to the present invention.
Figure 2:
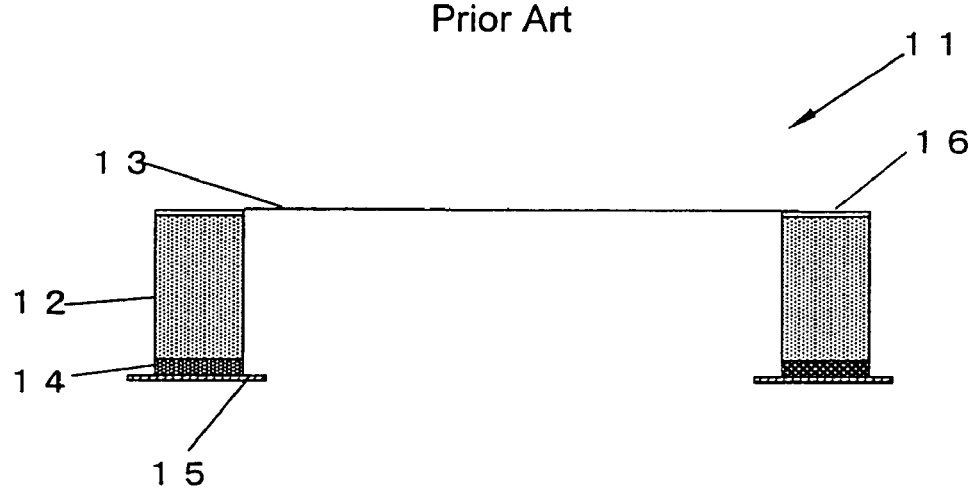
FIG. 2 is a schematic sectional view showing a general constitution of a pellicle.

FIG. 1 schematically shows one example of a pellicle according to the present invention. This pellicle 1 is that a pellicle film 3 is adhered to an upper end face of a pellicle frame 2 through an adhesive for adhering pellicle film. Moreover, a reticle adhesive layer is formed on a lower end face of the frame 2, and further a liner is detachably adhered to a lower face of the adhesive layer.

With regard to such a structure, there is a similar one also in conventional pellicles. However, the pellicle frame 2 according to the present invention is made of an aluminum alloy whose surface is anodized, and each content of sulfate ion, nitrate ion, chlorine ion, and organic acid (total of oxalic acid, formic acid, and acetic acid) is suppressed to be 1.1 ppm or less in elution concentration after immersed in 100 ml of pure water at 25° C. for 168 hours, per 100 $cm^2$ of a surface area of the frame.

A method for producing a pellicle frame according to the present invention isn't particularly limited, for example, each content of acids can be suppressed as follows.

A parent material of the pellicle frame is an aluminum alloy, for example, an Al—Mg alloy, an Al—Mg—Si alloy, or an Al—Zn—Mg—Cu alloy, particularly, a JIS A5052 material, a JIS A6061 material, or a JIS A7075 material can be preferably used. These aluminum alloys are lightweight, have high strength, and are difficult to deform, and therefore they are appropriate for a parent material of the pellicle frame. However, the parent material of a pellicle frame according to the present invention is not limited to the above-described one, and other aluminum alloy materials can also be used as long as strength as a pellicle frame and so forth are ensured.

A frame in which an aluminum alloy is used as a parent material is anodized. In general, before the anodization, a surface of the frame is roughened by sandblasting or by chemical polishing. For example, the surface of the frame can be sandblasted by using stainless, carborundum, glass beads and such, and furthermore chemically polished by NaOH and such. Thereby the surface can be roughened.

The anodization of the surface of the frame can be performed by a known method. Generally, the anodization is performed in an acid electrolysis solution. As an acid electrolysis solution, a sulfuric acid aqueous solution, an oxalic acid aqueous solution, and such, can be used. For example, if the anodization is performed in the sulfuric aqueous acid solution, a dense oxide film (an alumite film) is formed on a surface of the Al alloy, and cylindrical fine holes are regularly formed in the oxide film. And in an anodizing process, sulfate ions in the aqueous solution are taken in the anodic oxide film, however the sulfate ions and such which have been taken in the anodic oxide film cannot be sufficiently removed by a general cleaning method.

Accordingly, in the present invention, before a staining treatment and such are performed, for example, sulfate ions in the holes of the anodic oxide film are sufficiently removed by sufficiently cleaning in pure water. In this cleaning with pure wafer, by using together a method such as ultrasonic cleaning, oscillating, or forced circulation, the sulfate ions in the film can be more efficiently removed.

Followed by the alumite film formation, staining, sealing, and such are performed. In these steps, acetate components and such in a treatment solution are adhered to the film or taken in the film. Therefore, also after these steps, cleaning is sufficiently performed by using pure water to sufficiently remove acetate ions and such in the holes of the film. Also, in the cleaning with pure water here, by using together a method such as ultrasonic cleaning, oscillating, or forced circulation, acetate ions and such can be more efficiently removed from the film.

In the production of a pellicle frame in which a aluminum alloy is used as a parent material, there are some cases where etching is performed by using nitric acid and such for removing products occurring on a surface of the alumite film. Also, after performing the treatment by using nitric acid and such as described above, residual acids are sufficiently removed by using pure water, according to need, by performing ultrasonic cleaning, oscillating, forced circulation, or the like.

After each of processes such as anodic oxide film formation, staining, and sealing as described above, sulfuric acid, nitric acid, and such in the oxide film can be efficiently removed by sufficiently cleaning using pure water.

Sulfuric acid, nitric acid, and such in the oxide film can be reduced by cleaning using pure water as described above. However, when anodization is performed, an anodic oxide film in which taking sulfuric acid and such are suppressed may be formed. In the anodization, in the case of using an acidic electrolysis solution, for example, an acid that has a property of solving aluminum alloy, such as sulfuric acid or oxalic acid, innumerable holes are formed in the oxide film as described above. And, these holes are used to perform staining and coloring in an alumite treatment. A main cause of acid components contained in the film is thought that they are also taken in the holes.

Accordingly, by changing property of the film in itself, namely, geometric structure of the holes in which sulfate ions are taken, each content of sulfate ions and such can be suppressed to be low. By changing chemical conversion conditions such as an anodization voltage, hole structure such as diameter of cell, size of cell, number of cells, and thickness of bottom of cell can be controlled (See, Masuda, Oyobuturi (applied physics), Vol. 72, No. 10 (2003)). Namely, by making a diameter of hole smaller or reducing the number of the holes, the total amount of acid components that are taken in the holes can be suppressed to be small.

Moreover, after the anodization, by adjusting the sealing condition to appropriately seal the vicinity of each mouth of the holes, elution amount of acids can be reduced more. Therefore, by controlling each diameter or the number of the holes, thereafter cleaning along with ultrasonic wave, oscillation, forced circulation, and such, is sufficiently performed by using pure water, and thereby each content of acids in the anodic oxide film can be reduced still more.

A content of acid components in the film is suppressed by controlling each diameter of the holes and such through anodizing or sealing according to need as described above, and cleaning with a pure water is sufficiently performed, thereby there is obtained a pellicle frame on whose surface an anodic oxide film is formed. Therefore, when this frame is immersed in pure water, each content of sulfate ion, nitrate ion, chlorine ion, and organic acid (total of oxalic acid, formic acid, and acetic acid) is made to be 1.1 ppm or less in elution concentration after immersed in 100 ml of pure water at 25° C. for 168 hours, per 100 $cm^2$ of a surface area of the frame.

A size of the pellicle frame isn't particularly limited, and, for example, can be that of a pellicle frame for a pellicle for a semiconductor lithography, a pellicle for lithography process of producing a large liquid crystal display panel, or the like. A vent 6 is provided on one side surface of the pellicle frame shown in FIG. 1. Size, shape, number, and position of the vent 6 are not particularly limited and may be appropriately provided. However, if a needlessly large vent is formed, dust and such are easy to enter therein. Therefore, it is preferable that minimum amounts of vent are formed.

A dustproof filter 7 is provided in the vent 6. With regard to the filter 7, there may be selected size, shape, number, position, and such depending on an area of filtration, a necessary quantity of airflow and the like. As a material of the filter 7, there can be quoted a resin (PTFE, nylon 66, and such), a metal (316L stainless steel and such), ceramics (alumina, aluminum nitride, and such), and so forth.

Moreover, an outside part of the dustproof filter 7 may be provided with a chemical filter that adsorbs or resolves chemical substance in the environment. By providing such a chemical filter, generation of compounds can be more effectively prevented.

And, for producing a pellicle by using the pellicle frame according to the present invention as described above, a pellicle film is adhered to an upper end surface of the pellicle frame through an adhesive layer for adhering a pellicle film. Moreover, an adhesive layer for adhering a reticle is formed on a lower end face of the frame, a mold release layer (a liner) is detachably adhered to a lower end face of the adhesive layer for adhering a reticle.

In addition, with regard to other components constituting the pellicle, namely, a pellicle film, an adhesive and so on, known ones can be used.

With regard to the pellicle film, for example, there can be used an amorphous fluorinated polymer and such which have been conventionally used for an excimer laser, concretely there can be quoted Cytop (manufactured by Asahi Glass CO., Ltd., trade name), Teflon (registered trade mark) AF (manufactured by DuPont, trade name), and such. These polymers may be dissolved in a solvent to make a film according to need when the pellicle film is produced. For example, they can be appropriately dissolved in a fluorinated solvent and such.

The adhesive for adhering a pellicle film is not particularly limited, and, for example, there is quoted an acrylic resin adhesive, a silicone resin adhesive, a fluorinated polymer such as a silicone adhesive containing fluorine, and so forth. Particularly, the fluorinated polymer can be preferably used, concretely, there can be quoted a fluorinated polymer CT69 (manufactured by Asahi Glass CO., Ltd., trade name). For example, an adhesive layer for adhering a pellicle film is formed by diluting the above adhesive with a solvent according to need, applying it to an upper end face of the pellicle frame and heating to dry and harden it. In this case, for a method of applying the adhesive, there can be adopted a method by brush application, spray, or auto-dispenser, and so forth.

Moreover, for an adhesive layer (a sticking layer) for adhering a reticle, there can be used a pressure sensitive adhesive double coated tape, a silicone resin sticking agent, an acrylic sticking agent, and such.

Furthermore, materials for a liner for protecting reticle adhesive layer are not particularly limited, for example, there can be quoted PET, PTFE, PFA, PE, PC, vinyl chloride, PP, and such.

If a pellicle is produced by using the pellicle frame in which each content of sulfate ion and such in the anodic oxide film is suppressed as described above, generation of compounds caused by acids in the anodic oxide film of the frame can be suppressed and thus haze can be extremely effectively prevented from being generated even in a photolithography process in which a light with a short wavelength is used.

EXAMPLES

Hereinafter, examples and comparative examples according to the present invention will be explained.

Example 1

As a pellicle frame, two frames made of an aluminum alloy of A7075-T651 in which a frame outer size was 149 mm×122 mm×5.8 mm and a frame thickness was 2 mm were prepared. A vent with a diameter of 0.5 mm was provided in the center of one side of each of the frames. After a surface of the frame was cleaned, the surface was roughened by surface treatment using glass beads for a minute in a sandblasting apparatus with discharge pressure of 1.5 kg/cm$^2$.

The pellicle frames were treated to cleaning in an NaOH treatment bath for ten minutes, and thereafter anodized in a 14% sulfuric acid aqueous solution at a liquid temperature of 18° C. with a chemical conversion voltage of 10 V (1.3 A). The frames after the anodization were subjected to ultrasonic cleaning for ten minutes in ultrapure water to remove acid components in the film. In addition, during the ultrasonic cleaning in ultrapure water, the ultrapure water was continuously exchanged for new pure water.

Next, after a black oxide film was formed on a surface of the frames by blackening-staining and sealing, the frame was cleaned for ten minutes by ultrapure water using an ultrasonic cleaning-apparatus.

After the cleaning, one of the pellicle frames was cut into several pieces, these pieces was put in a polyethylene container, 100 ml of pure water per 100 cm$^2$ of the frame surface area except for the cut surface was added therein, hermetically sealed, and then immersed for 168 hours with being kept at a temperature 25° C.

An extracted water in which elution components from the frame were extracted in the above manner was analyzed by using an ion chromatography-analyzing apparatus (manufactured by Dionex, 2050i type). From this extracted water, there were detected impurities of sulfate ions of 0.1 ppm, nitrate ions of 0.1 ppm, chlorine ions of 0.01 ppm, organic acids (total of oxalic acid, formic acid, and acetic acid) of 0.2 ppm, respectively.

As to the other frame, an inner surface of the frame was coated with a silicone sticking agent by a thickness of 1 μm by using a spray coating-apparatus.

A filter was provided in the vent. The material of the filter is PTFE, the size thereof is that the width is 9.5 mm, the height is 2.5 mm, and the thickness is 300 μm. Moreover, the filter has a dust-filtrating size of 99.9999% in terms of 0.1 μm-3.0 μm, and there were provided a dustproof filter and a chemical filter on the outside thereof.

A silicone sticking agent (a reticule adhesive) is applied-to one end surface of this frame, heated at 100° C. for 10 minutes and dried to harden. Moreover, after the fluorine polymer CTX (manufactured by Asahi Glass Co., Ltd., trade name) diluted with a fluorine solvent CT Solve 180 (manufactured by Asahi Glass Co., Ltd., trade name) was applied to the other end face of the frame, and heated at 100° C. for 10 minutes to be dried and hardened. Furthermore, a liner made of PET was adhered to the reticule adhesive by a liner adhering-apparatus.

On the other hand, a pellicle film was made as follows. First, Teflon (registered trademark) AF1600 (manufactured by DuPont, trade name) was dissolved in a fluorine solvent, Fluorinert FC-75 (manufactured by 3M, trade name) to prepare a solution of concentration of 8%. By using the solution, a transparent film with a thickness of 0.8 μm was formed on a surface of mirror-polished silicon substrate with a diameter of 200 mm and a thickness of 600 μm by using a spin coater.

To this film, a frame for adhering in which an outer size was 200 mm×200 mm×5 mm in width and a thickness was 5 mm was adhered using an epoxy adhesive, Araldite Rapid (manufactured by Showa Highpolymer Co., Ltd., trade name) and separated in a water.

After this pellicle film was closely adhered to the pellicle frame, the frame was heated by an IR lamp, and thereby the film was fused to the frame. Here, the pellicle frame was attached to a fixing jig with an adhesion surface of the frame upward, and a tension of 0.5 g/cm was applied to a film part of the outside of the pellicle frame by the frame for adhering.

Next, a cutter and a tubular dispenser are used, and while the cutter is moved along a peripheral part of the adhesive portion of the pellicle frame with dropping Fluorinert FC-75 (manufactured by DuPont, trade name), unnecessary portions of the film of the outside of the pellicle frame were cut to remove.

The pellicle finished as described above was adhered to a 6 inches photomask substrate(reticule: cleaned in a condition that a concentration of surface residual acid components was 1 ppb or less), which was made of quartz glass on which a Cr test pattern was formed.

This was loaded into an ArF excimer laser scanner NSR S306C (manufactured by Nikon co., Ltd., trade name), and was irradiated with irradiation amount of 500 J/cm$^2$ under a reticule surface exposure intensity of 0.01 mJ/cm$^2$/pulse and a repetition frequency of 4000 Hz.

As a result of observation of a photomask surface after the irradiation by a laser foreign material-detecting apparatus, there was generated neither haze nor foreign material on both a part of the test pattern and a glass part.

Example 2

Two frames made of aluminum alloy like Example 1 were prepared. A vent with a diameter of 0.5 mm was provided in the center of one side of each frame. After a surface of each frame was cleaned, the surface was roughened by surface treatment using glass beads for a minute in a sandblasting apparatus with discharge pressure of 1.5 kg/cm$^2$.

The pellicle frames were treated to cleaning in an NaOH treatment bath for ten minutes, and thereafter anodized in a 14% sulfuric acid aqueous solution with a chemical conversion voltage of 25 V (0.5 A). The frames were subjected to ultrasonic cleaning for ten minutes in ultrapure water to remove acid components in the film. During the ultrasonic cleaning in ultrapure water, the ultrapure water was continuously exchanged for new pure water.

Next, a black oxide film was formed on a surface of the frames by blackening-staining and sealing. Thereafter, the frames were further cleaned by ultrapure water using an ultrasonic cleaning-apparatus.

One of the finished pellicle frames was cut into several pieces, these pieces was put in a polyethylene container, and 100 ml of pure water per 100 cm$^2$ of the frame surface area except for the cut surface was added therein, hermetically sealed, and then immersed for 168 hours with being kept at a temperature of 25° C.

An extracted water in which elution components from the frame were extracted was analyzed in the same manner as Example 1. From this extracted water, there were detected impurities of sulfate ions of 0.1 ppm, nitrate ions of 0.05 ppm, chlorine ions of 0.05 ppm, and organic acids (total of oxalic acid, formic acid, and acetic acid) of 0.1 ppm, respectively.

An inner surface of the other frame was coated with a silicone adhesive in the same manner as Example 1. A filter was provided in the vent. And a pellicle was produced by using this pellicle frame in the same manner as Example 1.

The pellicle was adhered to a photomask substrate and irradiated by an ArF excimer laser, and the photomask surface after the irradiation was observed. Consequently, there were generated neither haze nor foreign material on both a part of the test pattern and a glass part.

Comparative Example 1

Two frames made of an aluminum alloy like Example 1 were prepared. After surface-cleaning, surface-roughening, and cleaning treatment in NaOH were performed, the frames were anodized in a 14% sulfuric acid aqueous solution with a chemical conversion voltage of 10 V (1.3 A).

Next, a black oxide film was formed on a surface of the frames by blackening-staining and sealing. Thereafter, the frames were cleaned for 5 minutes by ultrapure water using an ultrasonic cleaning-apparatus.

One of the pellicle frames was cut into several pieces, these pieces was put in a polyethylene container, 100 ml of pure water per 100 cm$^2$ of the frame surface area except for the cut surface was added, hermetically sealed, and then immersed for 168 hours with being kept at a temperature of 25° C.

The extracted water in which elution components from the frame were extracted in the above manner was analyzed. Consequently, there were detected impurities of sulfate ions of 4.0 ppm, nitrate ions of 1.0 ppm, chlorine ions of 1.0 ppm, organic acids (total of oxalic acid, formic acid, and acetic acid) of 5.0 ppm, respectively.

Next, an inner surface of the other frame was coated with a silicone sticking agent in the same manner as Example 1. A filter was provided in the vent. Furthermore, a pellicle was finished by providing a pellicle film and such.

The pellicle was adhered to photomask substrate and irradiated by an ArF excimer laser, and the photomask surface after the irradiation was observed in the same manner as Example 1. Consequently, there were generated neither haze nor foreign material on a part of the test pattern. However, there was recognized generation of haze on a glass part. By analyzing this through an apparatus for laser raman spectroscopic analysis, this was found to be ammonium sulfate.

Also, under other conditions, two pellicle frames were produced respectively, and furthermore, a pellicle in which one of them was used was produced. In the same manner as Example 1, an extracted water was analyzed and irradiation and observation were performed to analysis if haze was generated or not. The results were summarized in Table 1.

TABLE 1

| | Chemical Conversion Condition | Ultrasonic Cleaning Time with Pure Water | SO$_4$ ion | NO$_3$ ion | Organic Acids | Cl ion | Generation of Haze |
|---|---|---|---|---|---|---|---|
| Example 1 | 10 V, 1.3 A | 10 minutes | 0.1 ppm | 0.1 ppm | 0.2 ppm | 0.01 ppm | No |
| Example 2 | 25 V, 0.5 A | 10 minutes | 0.1 ppm | 0.05 ppm | 0.1 ppm | 0.05 ppm | No |
| Example 3 | 10 V, 1.3 A | 20 minutes | 0.05 ppm | 0.05 ppm | 0.1 ppm | 0.01 ppm | No |
| Example 4 | 10 V, 1.3 A | 6 minutes | 1.1 ppm | 1 ppm | 1 ppm | 0.05 ppm | No |
| Comparative Example 1 | 10 V, 1.3 A | 5 minutes | 4 ppm | 1 ppm | 5 ppm | 1 ppm | Existence |
| Comparative Example 2 | 5 V, 2.6 A | 10 minutes | 3 ppm | 1 ppm | 2 ppm | 0.1 ppm | Existence |

From Table 1, it was found that haze was not generated in the cases that each content of sulfate ion, nitrate ion, chlorine ion, and organic acid was 1.1 ppm or less.

The present invention is not limited to the embodiments described above. The above-described embodiments are mere examples and those having substantially the same constitution as technical ideas described in the claims of the present invention and providing the similar functions and advantages are included in the scope of the present invention.

For example, the form of the pellicle frame was not limited to the quadrangular one as shown in FIG. 1, the other forms are also possible and the size and such may be appropriately set.

What is claimed is:

1. A pellicle frame for constituting a pellicle for photolithography, wherein the frame is made of an aluminum alloy whose surface is anodized, and each content of sulfate ion, nitrate ion, chlorine ion, and organic acid (total of oxalic acid, formic acid, and acetic acid) which are contained in an anodic oxide film made by anodization is 1.1 ppm or less in elution concentration after immersed in 100 ml of pure water at 25° C. for 168 hours, per 100 cm$^2$ of a surface area of the frame.

2. The pellicle frame according to claim 1, wherein the aluminum alloy is an Al—Mg alloy, an Al—Mg—Si alloy, or an Al—Zn—Mg—Cu alloy.

3. The pellicle frame according to claim 2, wherein the aluminum alloy is a JIS A5052 material, a JIS A6061 material, or a JIS A7075 material.

4. A pellicle for photolithography comprising, at least, a pellicle frame and a pellicle film adhered to one end face of the pellicle frame, wherein the pellicle frame is the one according to claim 1.

5. A pellicle for photolithography comprising, at least, a pellicle frame and a pellicle film adhered to one end face of the pellicle frame, wherein the pellicle frame is the one according to claim 2.

6. A pellicle for photolithography comprising, at least, a pellicle frame and a pellicle film adhered to one end face of the pellicle frame, wherein the pellicle frame is the one according to claim 3.

* * * * *